United States Patent
Tanrikulu et al.

(10) Patent No.: US 7,433,908 B2
(45) Date of Patent: Oct. 7, 2008

(54) SELECTIVE-PARTIAL-UPDATE PROPORTIONATE NORMALIZED LEAST-MEAN-SQUARE ADAPTIVE FILTERING FOR NETWORK ECHO CANCELLATION

(75) Inventors: Oğuz Tanrikulu, Wellesley, MA (US); Kutluyil Dogancay, Campbelltown (AU)

(73) Assignee: Tellabs Operations, Inc., Naperville, IL (US)

( * ) Notice: Subject to any disclaimer, the term of this patent is extended or adjusted under 35 U.S.C. 154(b) by 1034 days.

(21) Appl. No.: 10/374,738

(22) Filed: Feb. 25, 2003

(65) Prior Publication Data

US 2004/0015529 A1  Jan. 22, 2004

Related U.S. Application Data

(60) Provisional application No. 60/396,298, filed on Jul. 16, 2002.

(51) Int. Cl.
    G06F 17/10 (2006.01)
(52) U.S. Cl. ..................................... 708/322
(58) Field of Classification Search ................. 708/322, 708/323
    See application file for complete search history.

(56) References Cited

U.S. PATENT DOCUMENTS

| 5,477,534 | A | * | 12/1995 | Kusano ...................... 370/286 |
| 5,909,426 | A | * | 6/1999 | Liau et al. ................... 370/203 |
| 5,951,626 | A | * | 9/1999 | Duttweiler .................. 708/322 |
| 6,498,850 | B1 | | 12/2002 | Walker et al. |
| 6,526,141 | B2 | * | 2/2003 | Benesty et al. ......... 379/406.09 |
| 6,580,795 | B1 | | 6/2003 | Li et al. |
| 6,842,516 | B1 | | 1/2005 | Armbruster |

OTHER PUBLICATIONS

Aboulnasr, T.: Mayyas, K: Complexity reduction of the NLMS algorithm via selective coefficient update; IEEE Transactions on Signal Processing, vol. 47, issue 5, May 1999, pp. 1421-1424.

Attallah, S.; Liaw, S.W.; Analysis of DCTLMS algorithm with a selective coefficient updating: IEEE Transactions on Circuits and Systems II: Analog and Digital Signal Processing, vol. 48, issue 6, Jun. 2001, pp. 628-632.

(Continued)

Primary Examiner—Chuong D Ngo
(74) Attorney, Agent, or Firm—Hamilton, Brook, Smith & Reynolds, P.C.

(57) ABSTRACT

A reduced-complexity, fast converging adaptive filter may be used for network echo cancellation applications, including applications having sparse echo paths. The new filter, referred to as a selective-partial-update proportionate NLMS filter, may be based on a proportionate NLMS (PNLMS) technique and selective partial updating of the adaptive filter coefficients. The new PNLMS filter may exploit sparseness of a communications channel to speed up the initial convergence of the NLMS technique included in the filter by weighting regressor data proportionately with an estimated magnitude of the channel impulse response. Selective partial updating is essentially a data selection method to reduce the computational complexity. The performance of the selective-partial-update PNLMS filter compares favorably to an adaptive filter using standard PNLMS for echo paths specified in ITU-T Recommendation G.168. Further, the selective-partial-update PNLMS filter maintains the convergence speed of a standard PNLMS filter at a reduced computational complexity.

36 Claims, 10 Drawing Sheets

OTHER PUBLICATIONS

Duttweiler, D.L., "Proportionate Normalized Least-Mean-Squares Adaptation in Echo Cancelers," *IEEE Transactions on Speech and Audio Processing*, vol. 8, No. 5, pp. 508-518, Sep. 2000.

Gay, S.L., "An Efficient, Fast Converging Adaptive Filter for Network Echo Cancellation," *IEEE*, 0-7803-5148-7/98, pp. 394-398, 1998.

Pitas, I., "Fast Algorithms for Running Ordering and Max/Min Calculation," *IEEE Transactions on Circuits and Systems*, pp. 795-804, vol. 36, No. 6, Jun. 1989.

Series G: Transmission Systems and Media, Digital Systems and Networks, ITU-T Recommendation G.168.

Haykin, Simon, *Adaptive Filter Theory, 3rd Ed.*, Chapter 9, Prentice Hall, 1996.

Goodwin, G.C., and Kwai Sang Sin, *Adaptive Filtering Prediction and Control*, Chapter 3, Prentice Hall, 1984.

Jenkins, W.K., et al., *Advanced Concepts in Adaptive Signal Processing*, pp. 22-23, 54-277, Kluwer Academic Publishers.

Benesty, J., *Advances in Network and Acoustic Echo Cancellation*, Springer, 2001.

Oguz Tanrikulu and Kutluyil Dogancay, "Selective-partial-update proportionate normalized least-mean-squares algorithm for network echo cancellation," Acoustics, Speech and Signal Processing, 2002 IEEE International Conference, vol. 2, 2002, pp. 1889-1892.

Dogancay, Kutluyil and Tanrikulu, Oguz, "Generalized subband decomposition LMS algorithm employing selective partial updates," Acoustics, Speech and Signal Processing, 2002 IEEE International Conference, vol. 2. 2002, pp. 1377-1380.

Dogancay, K. And Tanrikulu, O., "Adaptive filtering algorithms with selective partial updates," Circuits and Systems II: Analog and Digital Signal Processing, IEEE Transactions, vol. 48, Issue 8, Aug. 2001, pp. 762-769.

Dogancay, K., and Tanrikulu, O., "Normalised constant modulus algorithm with selective partial update," Acoustics, Speech and Signal Processing, 2001, Proceedings, 2001 IEEE International Conference on, 2001, pp. 2181-2184, vol. 4.

Dogancay, K., Tanrikulu, O., "Selective-partial-update NLMS and affine projection algorithms for acoustic echo cancellation," Acoustics, Speech and Signal Processing, 2000, ICASSP '00. Proceedings 2000 International Conference on, vol. 1, 2000.

* cited by examiner

US 7,433,908 B2

SELECTIVE-PARTIAL-UPDATE PROPORTIONATE NORMALIZED LEAST-MEAN-SQUARE ADAPTIVE FILTERING FOR NETWORK ECHO CANCELLATION

RELATED APPLICATION(S)

This application claims the benefit of U.S. Provisional Application No. 60/396,298, filed Jul. 16, 2002. The entire teachings of the above application are incorporated herein by reference.

BACKGROUND OF THE INVENTION

Network echo cancellation problems are characterized by long echo path impulse responses of the order of 128 ms, of which only a small portion (4-22 ms) is actually nonzero. Adaptive echo cancellers are designed to synthesize the full length of the echo path because (i) the location of the nonzero portion of the echo path (the flat delay) is unknown and (ii) the flat delay varies from call to call. The flat delay is due to the long distance between the echo canceller and the hybrid/local-loop circuit.

A recently proposed modification of NLMS—the Proportionate Normalized Least-Mean-Squares (PNLMS) algorithm (see D. L. Duttweiler, "Proportionate Normalized Least-Mean-Squares Adaption in Echo Cancelers," *IEEE Trans. of Speech and Audio Processing*, vol. 8, no. 5, pp. 508-518, September 2000 and S. L. Gay, "An Efficient, Fast Converging Adaptive Filter for Network Echo Cancellation," in *Proc. ASILOMAR*, November 1998, pp. 394-398)—exploits the sparseness of the echo path impulse response to speed up the initial convergence of the conventional NLMS algorithm. PNLMS essentially adapts the nonzero portion of the echo path by weighting the update terms of the adaptive filter with the magnitude of the estimated echo path impulse response. This effectively results in a shorter adaptive filter that converges faster than the full-length adaptive filter. The key to PNLMS is the introduction of weighting for adaptive filter coefficients. A particular choice for the weighting gives rise to PNLMS.

There are some disadvantages to PNLMS, namely, an increase in computational complexity by 50% and the slow convergence of the adaptive filter coefficients after the fast initial convergence. The latter is due to the slow convergence of small coefficients after the convergence of the large coefficients over the "active" portion of the echo path impulse response.

SUMMARY OF THE INVENTION

An inventive adaptive filter includes selective-partial-updating of adaptive filter coefficients and PNLMS. The adaptive filter receives an input signal and a desired signal, which is predicted from the input signal by the adaptive filter. The adaptive filter is partitioned into blocks, and each block is defined by adaptive filter coefficients and input signal values in that block. The adaptive filter (i) calculates a metric of each block, where the metrics are functions of the respective input signal values and coefficients and (ii) compares the metrics to select a given subset of blocks to update. The adaptive filter updates adaptive filter coefficients in the given subset of blocks.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

A description of preferred embodiments of the invention follows.

Adaptive filters can be used in various systems, but require powerful processors if time critical operation is needed. An example of such an application is an echo canceller in a telecommunications system.

Figure 1:
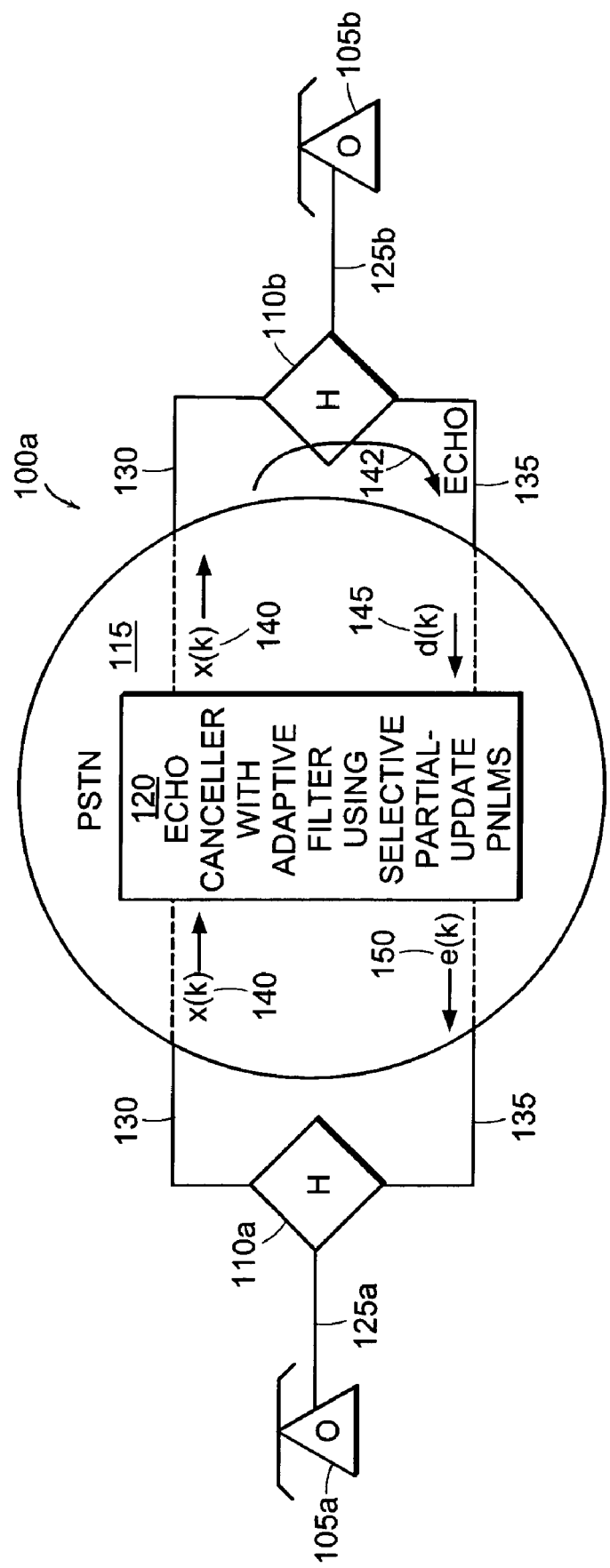
FIG. 1 is a schematic diagram of a telephony network in which an embodiment of the inventive adaptive filter is employed.

FIG. 1 is a schematic diagram of an example telecommunications system 100a in which an echo canceller 120 employs an adaptive filter having coefficients updated using a selective-partial-update proportionate normalized least-mean-square technique according to the principles of the present invention. This technique may be implemented in the time domain, as discussed herein, or in the frequency domain, in which case, the signals in the frequency bins may be normalized to prevent "lock-up," as discussed in related U.S. application Ser. No. 10/286,472, filed Oct. 31, 2002, the entire teachings of which are incorporated herein by reference.

Referring to FIG. 1, the telecommunications system 100a includes a near-end telephone 105a and a far-end telephone 105b. The near-end telephone 105a is connected to a near-end hybrid 110a via a telephone line 125a. The far-end telephone 105b is connected to a far-end hybrid 110b via a telephone line 125b. The near-end hybrid 110a is connected to the far-end hybrid 110b via telephone lines 130 and 135 that are part of a public switched telephone network (PSTN) 115. The echo canceller 120 resides in the PSTN 115 to receive an input signal x(k) 140 and to remove an echo signal 142 caused by the far-end hybrid 110b as a result of hybrid mismatch.

A desired signal d(k) 145 includes the echo signal 142, voice data (not shown), and noise. The echo canceller 120 adds an output signal (not shown) to the desired signal 145, where the output signal is predicted from the input signal 140 by an adaptive filter that uses the selective-partial-update proportionate normalized least-mean-square (PNLMS) technique. The adaptive filter is partitioned into blocks, and each block is defined by adaptive coefficients and input signal values in that block. The result of adding the output signal with the desired signal 145 is to offset the echo signal 142, leaving an error signal e(k) 150 that has essentially no echo signal 142.

Figure 2:
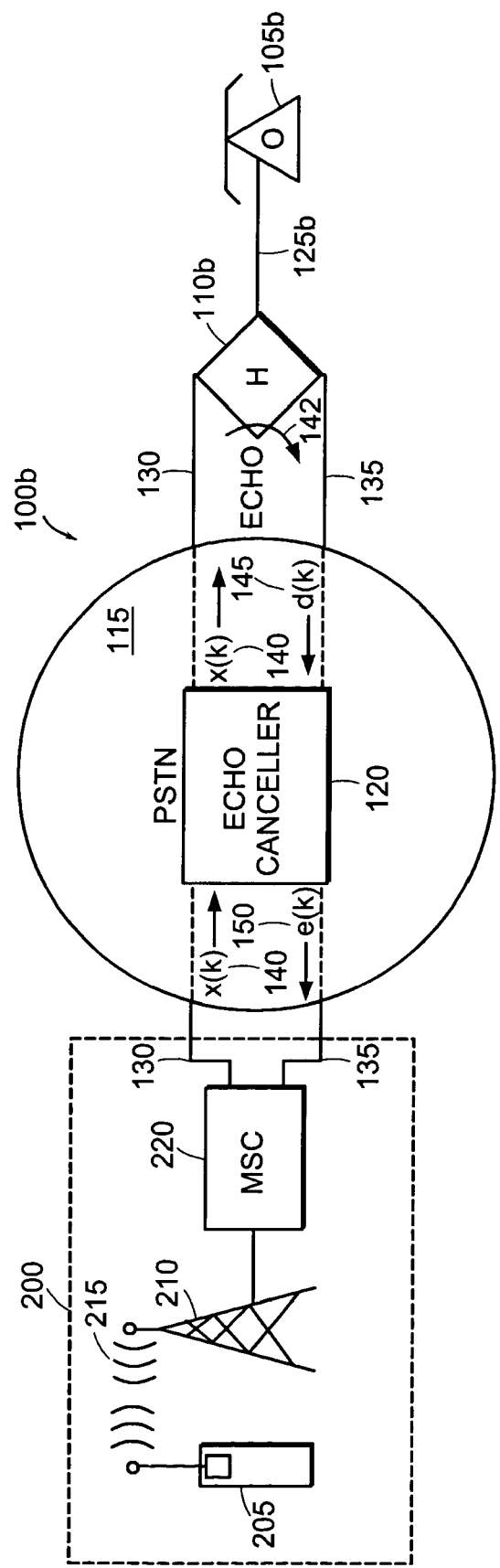
FIG. 2 is a schematic diagram of an alternative example communications network of FIG. 1.

FIG. 2 is a schematic diagram of an alternative example of the telecommunications system 100b in which the near-end telephone 105a, near-end hybrid 110a, and associated telephone line 125a are replaced with a wireless subsystem 200. The wireless subsystem 200 includes a handset 205 connected to a base station 210 via a wireless link 215. The wireless subsystem 200 also includes a mobile station controller (MSC) 220 connected to the PSTN 115, which, in this embodiment, employs the echo canceller 120 with adaptive filter and transmits voice signals via the telephone lines 130 and 135 to the far-end hybrid 110b.

Figure 3:
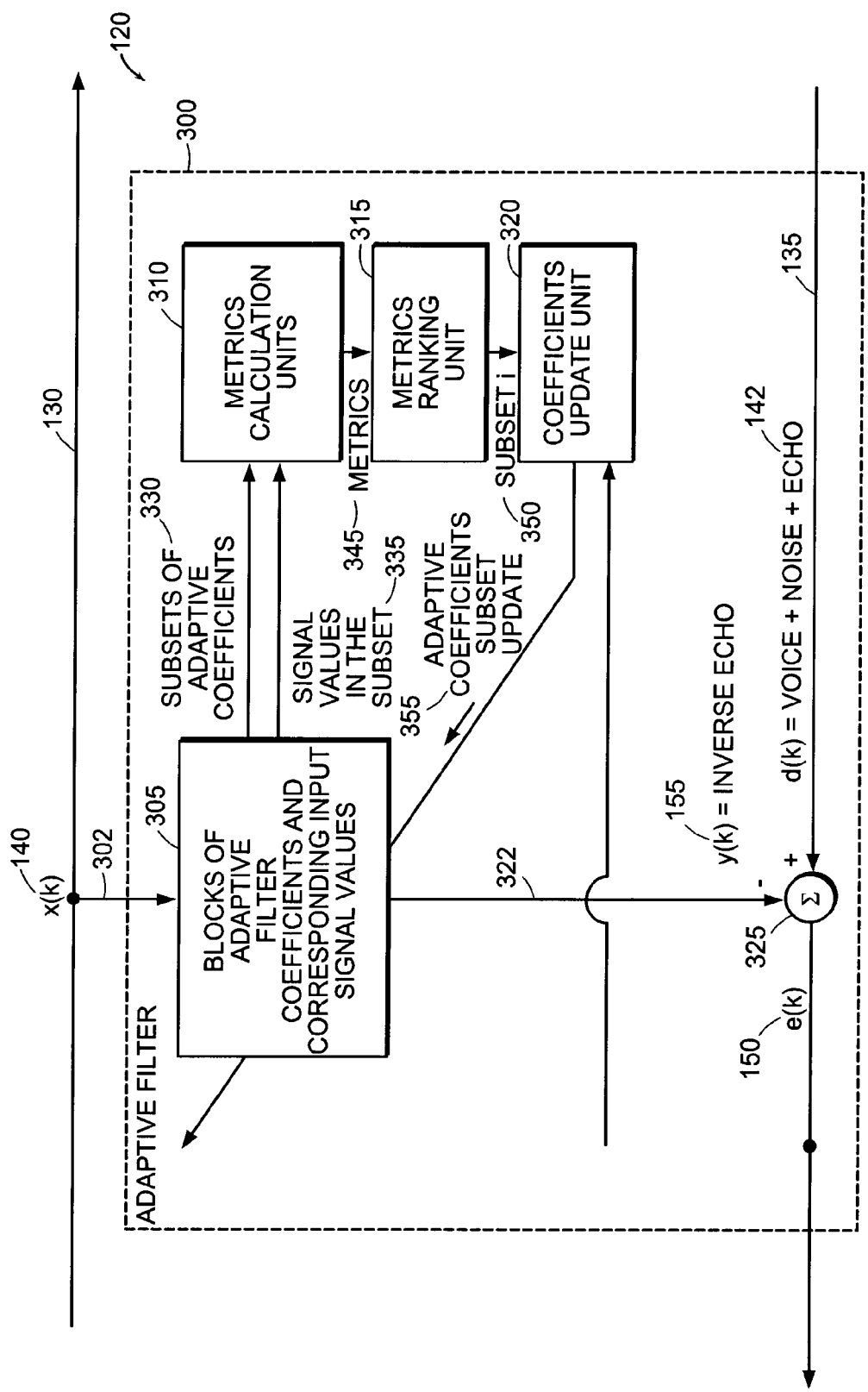
FIG. 3 is a schematic diagram of the adaptive filter of FIG. 1.

FIG. 3 is a block diagram of the inventive adaptive filter 300 in the echo canceller 120. The adaptive filter 300 receives the input signal 140 via the telephone line 130. The input signal 140 is received by the adaptive filter 300 through an input channel 302.

The adaptive filter 300 is organized into "blocks" 305, where each block is defined by the adaptive filter coefficients and corresponding input signal values in that block, discussed below in more detail in reference to FIG. 4.

Continuing to refer to FIG. 3, the blocks 305 are connected to metrics calculation units 310. The metrics calculation units 310 are connected to a metrics ranking unit 315. The metrics ranking unit 315 is connected to a coefficients update unit 320. The coefficients update unit 320 is also connected to the telephone line 135 and to the blocks 305.

In operation, the adaptive filter 300 receives the input signal 140 at the blocks 305. The blocks 305 process the input signal 140 to produce an output signal y(k) 155, which is designed to be an inverse of the echo signal 142. The output signal 155 is subtracted from the desired signal 145 by a summation unit 325. The output from the summation unit 325 is the error signal e(k) 150. The error signal 150 is fed back to the coefficients update unit 320 for use in updating the subsets of adaptive coefficients 330.

Within the adaptive filter 300, in operation, the subsets of adaptive coefficients 330 and signal values 335 in the blocks 305 are passed from the blocks 305 to the metrics calculation units 310. The metrics calculation units 310 determines metrics 345, at least one for each subset of adaptive coefficients 330.

The metrics calculation units 310 may calculate the metrics associated with the subsets by calculating a weighted power in each subset of adaptive coefficients 330. In calculating the metrics, the metrics calculation units 310 form a diagonal matrix, G. The diagonal matrix is a function of the respective subset of adaptive coefficients 330.

In one embodiment, the diagonal matrix, G, is calculated at every iteration of updating the adaptive filter 300. Specifically, the diagonal elements in the diagonal matrix may be calculated as a function of a vector having elements being the maximum of (i) the maximum adaptive coefficient in the subset multiplied by a scale factor or (ii) each of the magnitudes of the adaptive coefficients. Further, forming the diagonal matrix may include preventing errors caused as a result of the adaptive coefficients being very small and may include causing an individual adaptive filter coefficient to change when its magnitude is much smaller than the largest coefficient. Equations relating to forming the diagonal matrix are shown and discussed later in reference to equations (3a)-(3c).

The metrics 345 are passed from the metrics calculation units 310 to the metrics ranking unit 315. The metrics ranking unit 315 compares the metrics 345 to select a given subset of blocks to update. Comparing the metrics may include finding the block for which the coefficient is minimal in the squared-Euclidean-norm sense while satisfying a constraint that the adaptive coefficient at the next sample time multiplied by the corresponding signal at the present time is substantially identical to the desired response. Comparing the metrics may also include determining the block with the smallest weighted squared-Euclidean-norm update. The metrics ranking unit 315 outputs a selected subset 350 (e.g., subset i) according to a criterion or criteria as just described or other measures known in the art providing similar function.

The coefficients update unit 320 calculates updated adaptive filter coefficients for the selected subset 350 based on a number of factors, including: a present set of adaptive coefficients, the diagonal matrix determined by the metrics calculation units 310 corresponding to the selected subset 350, the input signal values corresponding to the selected subset 350, and the error signal 150. Based on the results of this calculation, the coefficients update unit 320 sends an adaptive coefficients subset update 355 to the blocks of adaptive filter coefficients 305 to update the corresponding subset of adaptive coefficients.

In operation, while the adaptive filter 300 is converging on a solution (i.e., the error of the adaptive filter coefficients 305 are being minimized), a "break point" can be determined to minimize the time it takes for the errors of the adaptive coefficients to be minimized. At the break point, the adaptive filter 300 may transition from (i) using a combination of adaptive filter coefficients 305 and input signal 140 to select the given subset of blocks to update to (ii) using only the input signal 140 to calculate the updated adaptive filter coefficients 305. In other words, the break point can be used as a trigger point for changing the functioning of the adaptive filter 300 from performing selective-partial-update PNLMS (SPU-PNLMS) to performing NLMS processing. The break point may be determined from echo return loss enhancement (ERLE) measurements.

The adaptive filter 300 is not restricted for use in echo cancellation applications. The adaptive filter 300 may be used in any application having long adaptive filters. For example, other applications for which the adaptive filter 300 may be used include channel equalization, sonar, radar, and system identification. Another application in which the inventive adaptive filter 300 may be used is multi-user detection Code Division Multiple Access (CDMA) systems (FIGS. 9A and 9B), where the adaptive filter 300 may be used to update a subset of coefficients in all demodulators each coefficient update iteration.

It should be understood that the metrics calculation units 310, metrics ranking unit 315, and coefficients update unit 320 may not be well-defined modules in practical implementation. In other words, there may not be, for example, separate subroutines for each of these units with parameters 345 and 350 being passed among them as indicated in FIG. 3. Because the units 310, 315, and 320 may be implemented as mathematical equations, there may be various ways in which the equations are implemented in, say, a digital signal processor (not shown). Thus, the parameters 345 and 350 may be used in succeeding equations rather than being passed in a typical subroutine manner. Also, each of the units 310, 315, and 320 has access to variables in the blocks 305.

Figure 4:
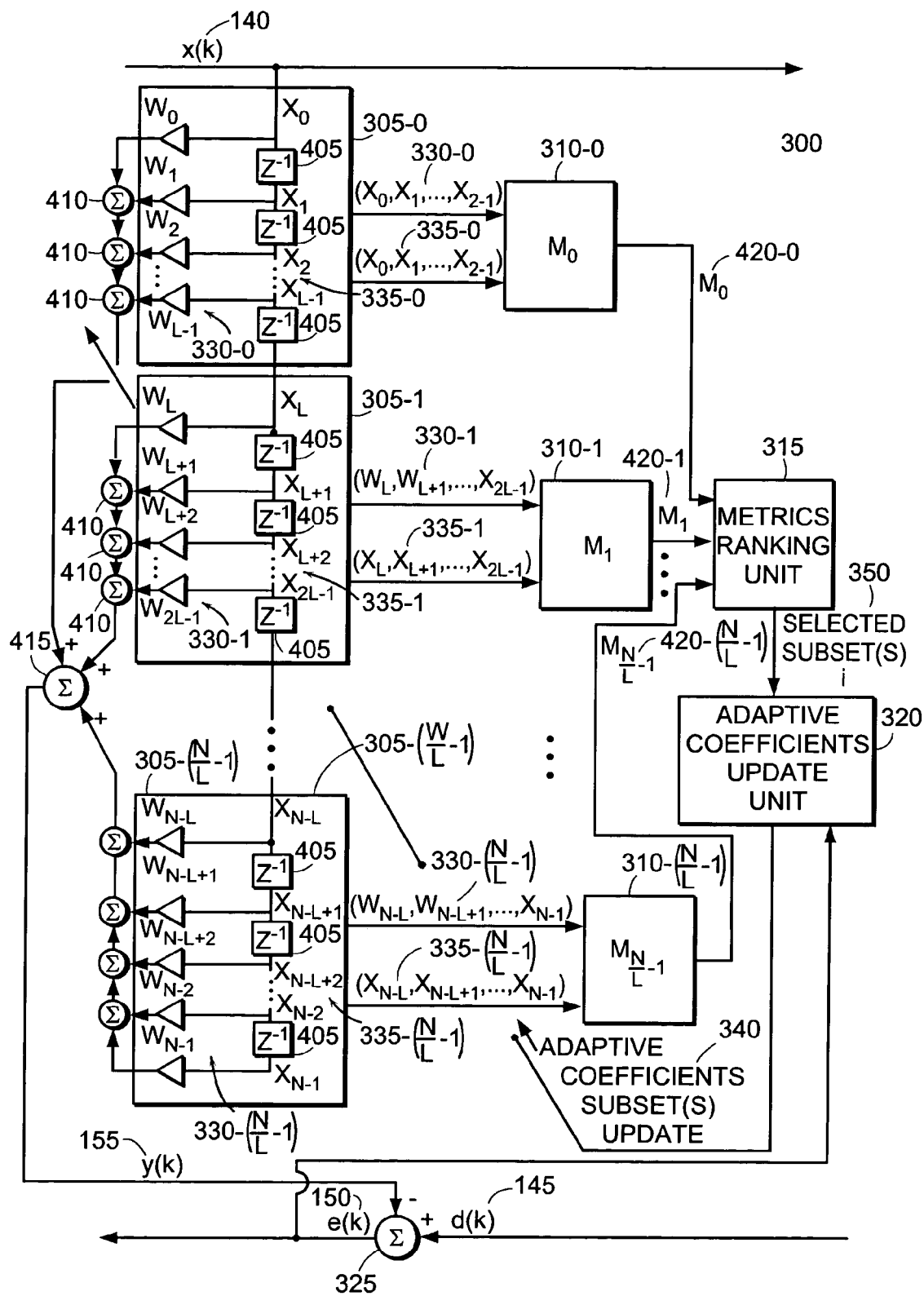
FIG. 4 is a detailed schematic diagram of the adaptive filter of FIG. 3.

FIG. 4 is a detailed block diagram of the adaptive filter 300. The blocks of adaptive filter coefficients 305 are depicted as individual blocks 305-0, 305-1, ..., 305-(N/L−1). Each of these blocks includes delay operators 405 and adaptive coefficients, $w_i$. The signal values $x_i$ in each block are multiplied by respective adaptive coefficients. The products $x_i w_i$ are summed by summation units 410, then summed again at summation unit 415. Alternatively, all of the products can be summed directly by just the latter summation unit 415. The output from the latter summation unit 415 is the adaptive filter output 155, which undergoes a sign change and is subtracted from the desired output 145 by another summation unit 325. The result of the subtraction produces the error signal 150, which is expected to have the echo signal 142 (see FIG. 3) minimized over time to the extent that the adaptive filter 300 is able to adaptively match the echo signal 142.

The metrics calculation units 310-0, 310-1, ..., 310-(N/L−1) receive the subsets of adaptive filter coefficients 330-0, 330-1, ..., 330-(N/L−1) and input signal values 335-0, 335-1, ..., 335-(N/L−1), respectively, from their corresponding blocks 305-0, 305-1, ..., 305-(N/L−1). Based on the adaptive filter coefficients 330 and input signal values 335, the metric calculation units 310 calculate corresponding metrics for each of the blocks in the adaptive filter 300. For example, implementation of the metric calculation units 310 is provided in more detail in FIGS. 5 and 6.

Figure 5:
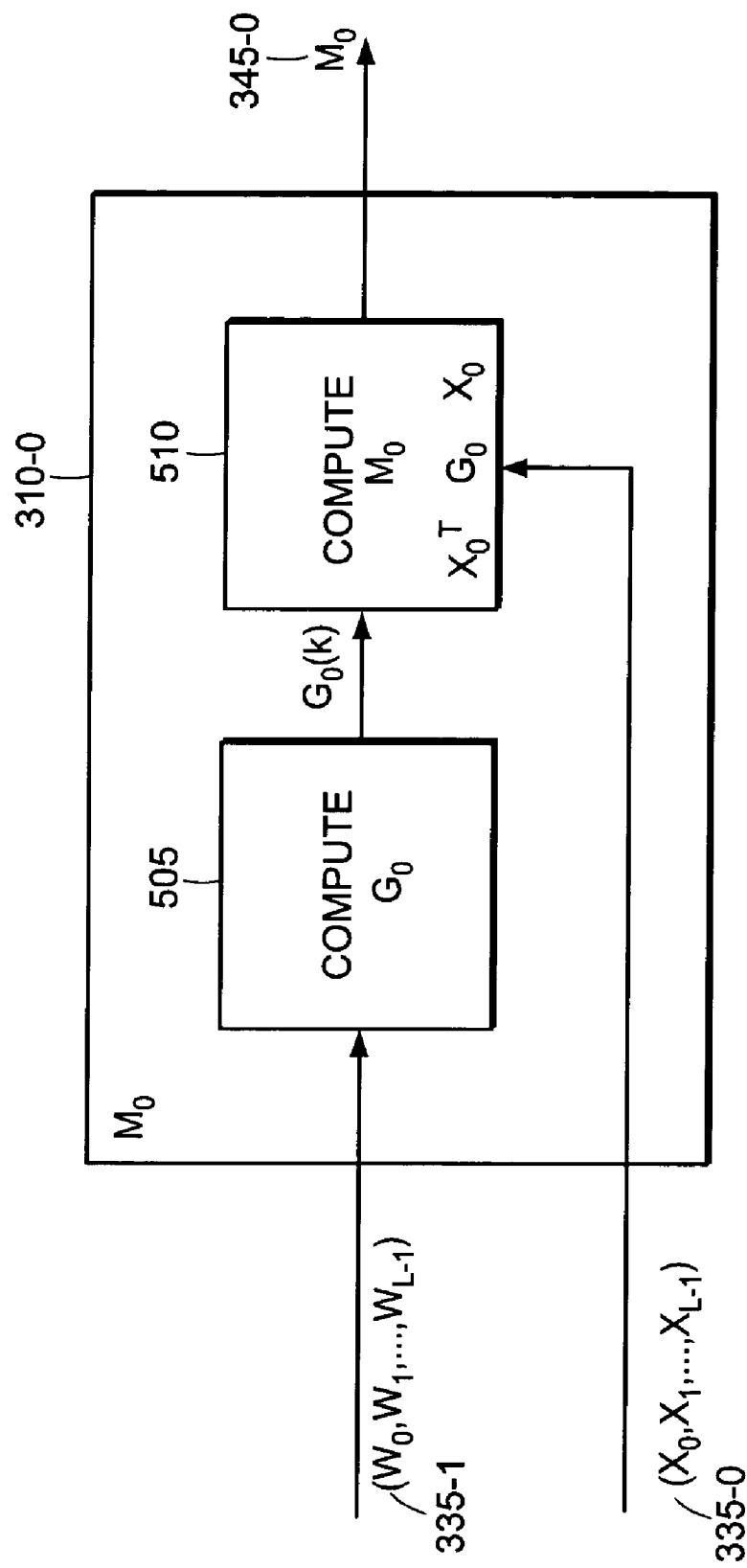
FIG. 5 is a block diagram of a metric calculation unit of FIG. 4.

FIG. 5 is a block diagram of the zero'th metric calculation unit 310-0. The metric calculation unit 310-0 includes two subunits 505 and 510, which compute a diagonal matrix $G_0$ and the metric $M_0$, respectively. The first subunit 505 receives the adaptive coefficients 330-0 from the first block 305-0. Example process steps for calculating the diagonal matrix $G_0$ are shown in FIG. 6.

Figure 6:
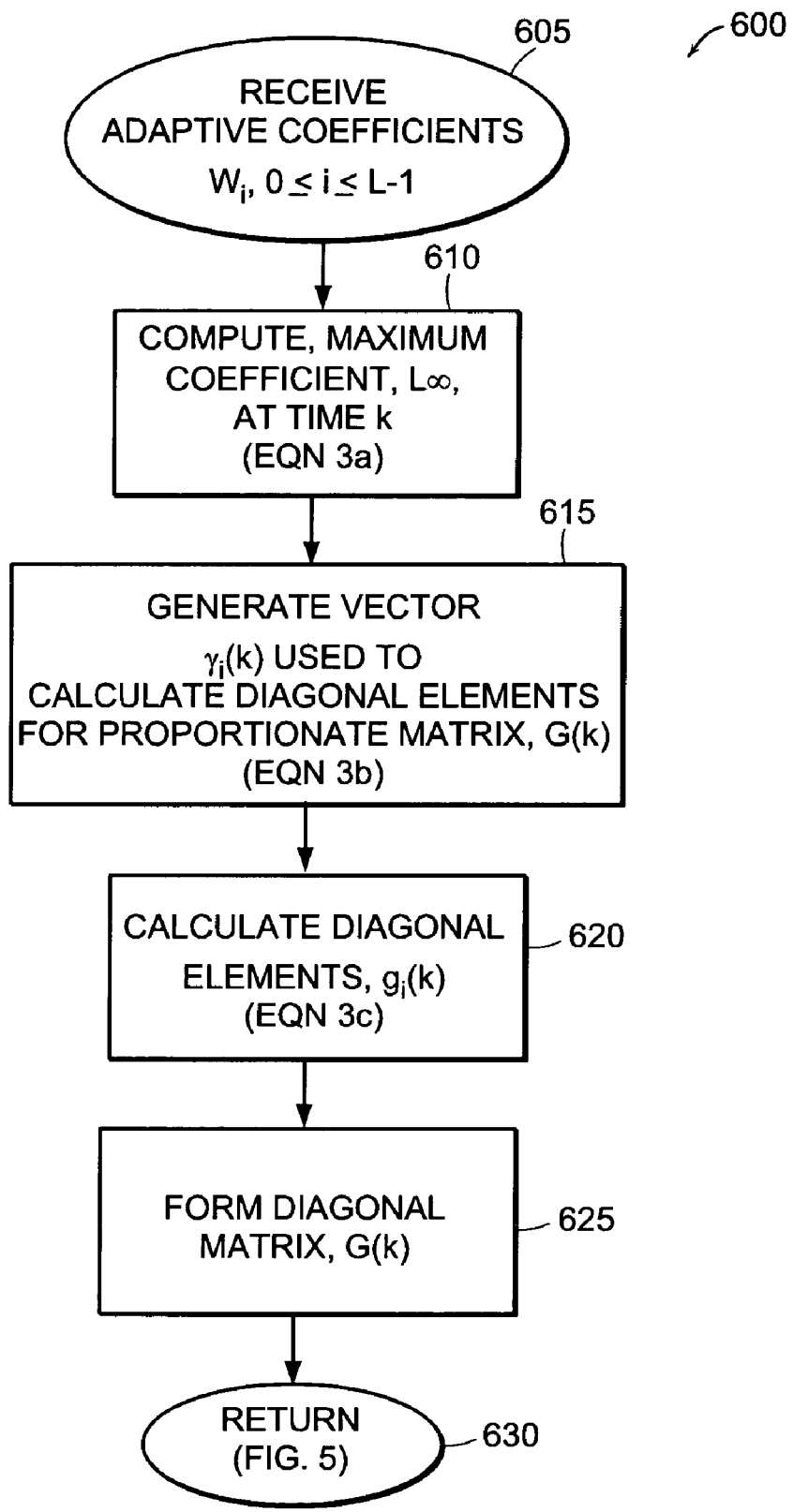
FIG. 6 is a flow diagram of a matrix processing unit of FIG. 5.

FIG. 6 is a flow diagram of a process used to calculate the diagonal elements of a diagonal matrix G, such as $G_0(k)$, and to form the G matrix. The process 600 begins in step 605 in which the adaptive coefficients, $w_i$ where $0 \leq i \leq L-1$, are received. In step 610, the process 600 computes a maximum coefficient, $L_\infty$, at time k. Computing the maximum coefficient may be computed according to equation (3a), presented and discussed below. In step 615, the process 600 generates a vector $\gamma_i(k)$ used to calculate diagonal elements for the proportionate matrix, G(k). Generating the vector $\gamma_i(k)$ may be done according to equation (3b), also presented and discussed below. In step 620, the process 600 may calculate the diagonal elements $g_i(k)$ according to equation (3c), also presented and discussed below.

In step 625, the process 600 forms the diagonal matrix G(k), where the diagonal elements are the calculated diagonal elements $g_i(k)$ from step 620. In step 630, the process 600 returns to FIG. 5 for the metric calculation unit 310-0 to finish computing the metric as a function of the diagonal matrix $G_0(k)$.

Referring again to FIG. 5, the second subunit 510 computes and outputs the metric $M_0$. The second subunit 510 computes the metric by calculating the following equation: $x_0^T G_0 x_0$. This equation is discussed later in reference to equation (9c). The result of solving this equation is the metric $M_0$ 345-0, which is presented to the metrics ranking unit 315 in FIG. 4.

Referring again to FIG. 4, the metrics ranking unit 315 selects the block 305 to be updated by determining the block with the smallest weighted squared-Euclidean-norm update, which is discussed later in reference to equation (4). The output from the metrics ranking unit 315 is the selected subset 350. Discussed later in reference to equation (10), the metrics ranking unit 315 may also be expanded to update more than one block 305 at every iteration; thus, there maybe multiple selected subsets 350.

Still referring to FIG. 4, the adaptive coefficients update unit 320 receives the selected subset(s) 350 and calculates updates for the selected blocks of adaptive coefficients (e.g., adaptive coefficients 330-0). The equations relating to updating the adaptive coefficients are provided in equations (8) and (10) below. The adaptive coefficients update unit 320 sends the adaptive coefficient subset(s) update 340 to the corresponding block(s) 305.

The adaptive filter process continues in this manner until reaching the "break point" as discussed above and further discussed below in the "parameter adjustments" section.

The following description derives the PNLMS algorithm with selective partial updates from a weighted cost function. The algorithm development is cast into the framework of a constrained optimization problem, which is different to the approach taken in D. L. Duttweiler, "Proportionate Normalized Least-Mean-Squares Adaption in Echo Cancelers," *IEEE Trans. on Speech and Audio Processing*, vol. 8, no. 5, pp. 508-518, September 2000.

Variants of PNLMS have been proposed to improve the convergence speed, to provide robustness in the face of undetected double-talk, and to reduce the computational complexity (S. L. Gay, "An Efficient, Fast Converging Adaptive Filter for Network Echo Cancellation," in *Proc. ASILOMAR*, November 1998, pp. 394-398 and J. Benesty, T. Gänsler, D. R. Morgan, M. M. Sondhi and S. L. Gay, *Advances in Network and Acoustic Echo Cancellation*, Springer-Verlag, Berlin, Germany, 2001).

The new technique presented herein provides further reduction in the computational complexity while maintaining the fast convergence of PNLMS.

For example, using the principles of the present invention, it is possible to reduce the increased computational complexity by way of selective partial updating of the adaptive filter coefficients. See K. Dogancay and O. Tanrikulu, "Adaptive filtering algorithms with selective partial updates," *IEEE Trans. on Circuits and Systems II*, vol 48, no. 8, August 2001, the entire teachings of which are incorporated herein by reference. PNLMS is a coefficient-selective technique in that it weights the coefficients to be updated in direct proportion to the magnitude of the coefficient estimates.

Selective partial updating introduces a data-selective flavor to PNLMS by selecting the regressor vector entries to be used in the update term. This in turn reduces the number of multiplications in the update term. The slow convergence of PNLMS after the initial fast convergence can be alleviated by providing a transition from PNLMS to NLMS during the adaptation process. This can be achieved by changing one of the PNLMS parameters as new data samples are received.

To start the derivation, let us show how PNLMS can be derived from the solution of a constrained minimization problem as in the case of NLMS. See G. C. Goodwin and K. S. Sin, *Adaptive Filtering, Prediction, and Control*, Prentice Hall, N.J., 1984. The output y(k) of a network echo canceller at time k is given by $$y(k) = w^T(k) x(k)$$

where $w(k) = [w_0(k), w_1(k), \ldots, w_{N-1}(k)]^T$ is the N×1 filter coefficient vector and $x(k) = [x(k), x(k-1), \ldots, x(k-N+1)]^T$ is the N×1 regressor vector of the far-end signal that excites the echo path. Introducing a weighting in the constrained optimization problem that leads to the NLMS algorithm yields $$\min_{w(k+1)} (w(k+1) - w(k))^T G^{-1}(k)(w(k+1) - w(k)) \quad (1)$$

$$\text{subject to } w^T(k+1)x(k) = d(k)$$

where $G(k) = \text{diag}\{g_0(k), g_1(k), \ldots, g_{N-1}(k)\}$ is the diagonal coefficient weighting matrix and $d(k)$ is the desired filter response which is the near-end signal (i.e., echo plus the near-end noise). The resulting PNLMS algorithm is given by the recursion $$w(k+1) = w(k) + \mu \frac{G(k)x(k)e(k)}{x^T(k)G(k)x(k)} \quad (2)$$

where $\mu$ is a stepsize introduced to control the convergence speed and $e(k)$ is the error (residual echo) signal defined by $$e(k) = d(k) - y(k).$$

Up to this point, we have not specified how the diagonal weighting matrix $G(k)$ should be formed. Indeed, this information is not essential for the purposes of algorithm derivation. While in general $G(k)$ can be chosen as any reasonable diagonal matrix with nonnegative entries, for PNLMS, the diagonal entries of $G(k)$ are chosen to approximate the magnitude of the estimated echo path impulse response. This results in an uneven distribution of the available energy in the regressor vector over the adaptive filter coefficients. If we set $G(i) = I$, PNLMS reduces to NLMS.

The PNLMS algorithm in equation (2) is somewhat different from the PNLMS recursion obtained in D. L. Duttweiler, "Proportionate Normalized Least-Mean-Squares Adaption in Echo Cancelers," *IEEE Trans. on Speech and Audio Processing*, vol. 8, no. 5, pp. 508-518, September 2000, where the normalization factor in the denominator of the update term is replaced by $x^T(k)x(k)$. In practice, to avoid division by zero (or a very small number), the normalization factor should be modified to $x^T(k)G(k)x(k) + \delta$ where $\delta$ is a small positive constant.

For PNLMS, the entries of the diagonal weighting matrix $G(k)$ are calculated at every iteration according to:

$$l_\infty(k) = \max\{\delta_p, |w_0(k)|, \ldots, |w_{N-1}(k)|\} \quad (3a)$$

$$\gamma_i(k) = \max\{\rho l_\infty(k), |w_{i(k)}|\}, 0 \leq i \leq N-1 \quad (3b)$$

$$g_i(k) = \frac{\gamma_i(k)}{\sum_{j=0}^{N-1} \gamma_j(k)}, 0 \leq i \leq N-1 \quad (3c)$$

where $\delta_p$ and $\rho$ are the PNLMS parameters that effect small-signal regularization. See S. L. Gay, "An Efficient, Fast Converging Adaptive Filter for Network Echo Cancellation," in *Proc. ASILOMAR*, November 1998, pp. 394-398). The parameter $\delta_p$ prevents the algorithm from misbehaving when the adaptive filter coefficients $w(k)$ are very small as at initialization, and $\rho$ prevents individual filter coefficients from freezing (i.e., being never adapted again) when their magnitude is much smaller than the largest coefficient $l_\infty$, see S. L. Gay, "An Efficient, Fast Converging Adaptive Filter for Network Echo Cancellation," in *Proc. ASILOMAR*, November 1998, pp. 394-398. Typical values for the PNLMS parameters are $\delta_p = 0.01$ and $\rho = 5/N$. If $\rho \geq 1$, $g_i(k) = 1/N$, i.e., $G(k) = \frac{1}{N}I$, and PNLMS behaves like NLMS.

To reduce computational complexity of the PNLMS algorithm by updating a subset of the filter coefficients at every iteration, the regressor vector $x(k)$ and the coefficient vector $w(k)$ are partitioned into M blocks of length $L = N/M$, where L is an integer:

$$x(k) = [x_1^T(k) x_2^T(k) \ldots x_M^T(k)]^T$$

$$w(k) = [w_1^T(k) w_2^T(k) \ldots w_M^T(k)]^T.$$

Let $G_i(k)$ denote the corresponding $L \times L$ block of $G(k)$. Here the coefficient vector blocks $w_1(k), \ldots, w_M(k)$ represent candidate subsets of $w(k)$ that can be updated at time instant k. For a single-block update, the constrained weighted minimization problem can be written as $$\min_{1 \leq i \leq M} \min_{w_i(k+1)} \|G_i^{-1/2}(k)(w_i(k+1) - w_i(k))\|_2^2 \quad (4)$$

$$\text{subject to } w^T(k+1)x(k) = d(k).$$

The solution to this optimization problem will find the block for which the coefficient update is minimal in the squared-Euclidean-norm sense while satisfying the constraint that $w^T(k+1)x(k)$ should be identical to the desired response $d(k)$.

We will first consider the minimization problem for a given block. If i is given and fixed, then equation (4) reduces to $$\min_{w_i(k+1)} \|G_i^{-1/2}(k)(w_i(k+1) - w_i(k))\|_2^2 \quad (5)$$

$$\text{subject to } w^T(k+1)x(k) = d(k)$$

which can be solved in a similar way to NLMS by using the method of Lagrange multipliers. See G. C. Goodwin and K. S. Sin, *Adaptive Filtering, Prediction, and Control*, Prentice Hall, New Jersey, 1984. The cost function to be minimized is $$J_i(k) = \|G_i^{-1/2}(k)(w_i(k+1) - w_i(k))\|_2^2 + \lambda(d(k) - w^T(k+1)x(k))$$

where $\lambda$ is a Lagrange multiplier. Setting $\partial J_i(k)/\partial W_i(k+1) = 0$ and $\partial J_i(k)/\partial \lambda = 0$, we get $$w_i(k+1) - w_i(k) - \frac{\lambda}{2} G_i(k) x_i(k) = 0 \quad (6a)$$

$$d(k) - (w^T(k+1)x(k)) = 0 \quad (6b)$$

Substituting equation (6a) into (6b), we get $$\frac{\lambda}{2} = \frac{e(k)}{x_i^T(k)G_i(k)x_i(k)} \quad (7)$$

After substituting equation (7) into (6a) and introducing a small positive stepsize $\mu$, we obtain the following recursion $$w_i(k+1) = w_i(k) + \mu \frac{G_i(k)x_i(k)e(k)}{x_i^T(k)G_i(k)x_i(k)}. \quad (8)$$

According to equation (4), the selection of the block to be updated should be made by determining the block with the smallest weighted squared-Euclidean-norm update. Thus, using equation (8), the block to be updated at every instant k is given by $$i = \operatorname*{argmin}_{1 \le j \le M} \|G_j^{-1/2}(k)(w_j(k+1) - w_j(k))\|_2^2 \quad (9a)$$

$$= \operatorname*{argmin}_{1 \le j \le M} \frac{e^2(k)}{x_j^T(k)G_j(k)x_j(k)} \quad (9b)$$

$$= \operatorname*{argmax}_{1 \le j \le M} x_j^T(k)G_j(k)x_j(k) \quad (9c)$$

Combining equations (8) and (9c) yields a selective-single-block-update PNLMS algorithm.

Let us suppose that we wish to update B blocks out of M at every iteration. Let $I_B = \{i_1, i_2, \ldots, i_B\}$ denote a B-subset (subset with B members) of the set $\{1, 2, \ldots, M\}$. Following the same line of development as above for updating B blocks results in the selective-partial-update PNLMS (SPU-PNLMS) algorithm given by $$w_{I_B}(k+1) = w_{I_B}(k) + \mu \frac{G_{I_B}(k)x_{I_B}(k)e(k)}{x_{I_B}^T(k)G_{I_B}(k)x_{I_B}(k)}, \quad (10)$$

$$I_B = \{i : x_i^T(k)G_i(k)x_i(k) \text{ is one of the } B \text{ largest among}$$

$$x_1^T(k)G_1(k)x_1(k), \ldots, x_M^T(k)G_M(k)x_M(k)\}$$

where $$x_{I_B}(k) = \left[x_{i_1}^T(k), \ldots, x_{i_B}^T(k)\right]^T$$

is the augmented vector containing the x(k) blocks with indices in $I_B$. Other augmented matrices and vectors are defined similarly.

The overhead introduced by the selection of coefficients using selective partial updating can be alleviated by employing fast ranking algorithms and strobe-down methods, see D. L. Duttweiler, "Proportionate Normalized Least-Mean-Squares Adaption in Echo Cancelers," *IEEE Trans. on Speech and Audio Processing*, vol. 8, no. 5, pp. 508-518, September 2000.

The parameter ρ appears to control the location of the "break point" in the algorithm convergence where the rapid initial convergence comes to an end. It also determines the extent to which the proportionate update characteristic of PNLMS is effective. As ρ decreases, the initial convergence rate becomes faster. See D. L. Duttweiler, "Proportionate Normalized Least-Mean-Squares Adaption in Echo Cancelers," *IEEE Trans. on Speech and Audio Processing*, vol. 8, no. 5, pp. 508-518, September 2000. However, decreasing ρ beyond 1/N does not increase the initial convergence speed very much. In fact, too small ρ slows down the convergence speed after the break point.

The convergence of PNLMS is faster than NLMS before the break point and slower than NLMS after the break point. Performance may be improved by having a convergence speed that is at least as fast as that of NLMS after the break point. These observations provide a hint as to how the PNLMS parameters should be adjusted to attain an ideal convergence behavior.

We propose to redefine ρ so that a transition from PNLMS to NLMS occurs around the break point. The most general approach to doing this is to replace ρ with a time-varying parameter ρ(k), whose definition is dependent on the break point B. An example ρ(k) is $$\rho(k) = \begin{cases} 5/N, & k \le B \\ 1, & k > B. \end{cases} \quad (11)$$

The location of B can be determined from the echo return loss enhancement (ERLE) measurements and the link between ERLE and ρ(k). See D. L. Duttweiler, "Proportionate Normalized Least-Mean-Squares Adaption in Echo Cancelers," *IEEE Trans. on Speech and Audio Processing*, vol. 8, no. 5, pp. 508-518, September 2000.

Figure 7:
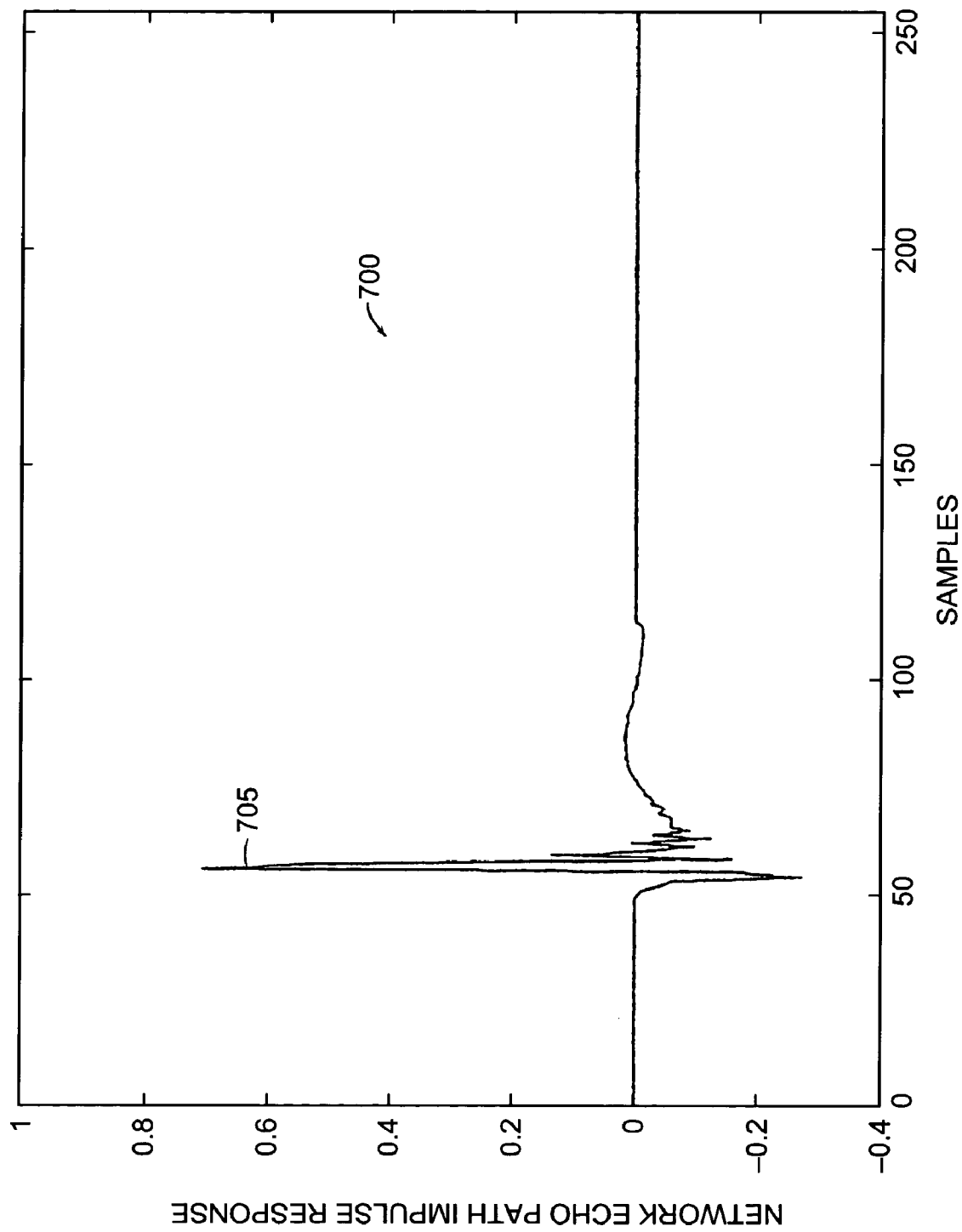
FIG. 7 is a time plot of a network echo path impulse response as specified in ITU-T Recommendation G.168 for the communications systems of FIG. 1.
Figure 8A:
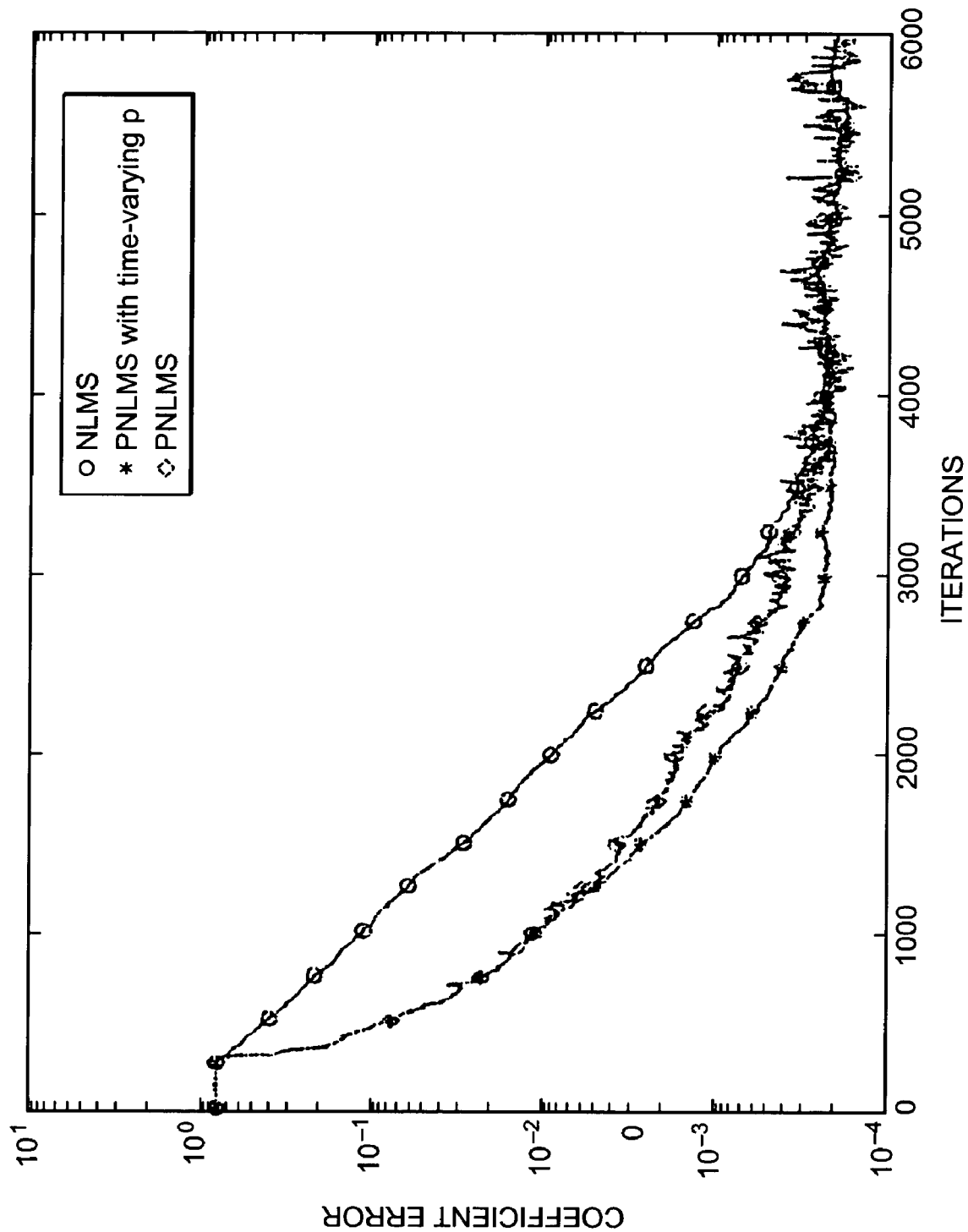
FIGS. 8A and 8B are iteration plots of coefficient error for the adaptive filter coefficients of FIG. 4.

FIG. 7 shows the application of PNLMS to a sparse network echo path specified in International Telecommunication Union, *Digital Network Echo Cancellers*, Recommendation ITU-T G.168, April 2000. FIG. 8A is an iteration plot having a set of curves used to compare the convergence of NLMS with standard PNLMS, as well as PNLMS with time varying ρ as in equation (11), where N=256, μ=0.4, ρ=5/N, B=800, and SNR=30 dB. The PNLMS algorithm using equation (11) attains a faster convergence speed than both NLMS and standard PNLMS by about 1000 iterations. In fact, its convergence rate approximates the faster of the two algorithms.

The convergence speeds of PNLMS and its reduced-complexity variant SPU-PNLMS have been simulated for the sparse network echo path in FIG. 7. The echo excitation signal x(k) is zero-mean, unit-variance white Gaussian noise. The near-end noise is also zero-mean white Gaussian. The signal-to-noise ratio (SNR) for the echo signal is 30 dB.

Figure 8B:
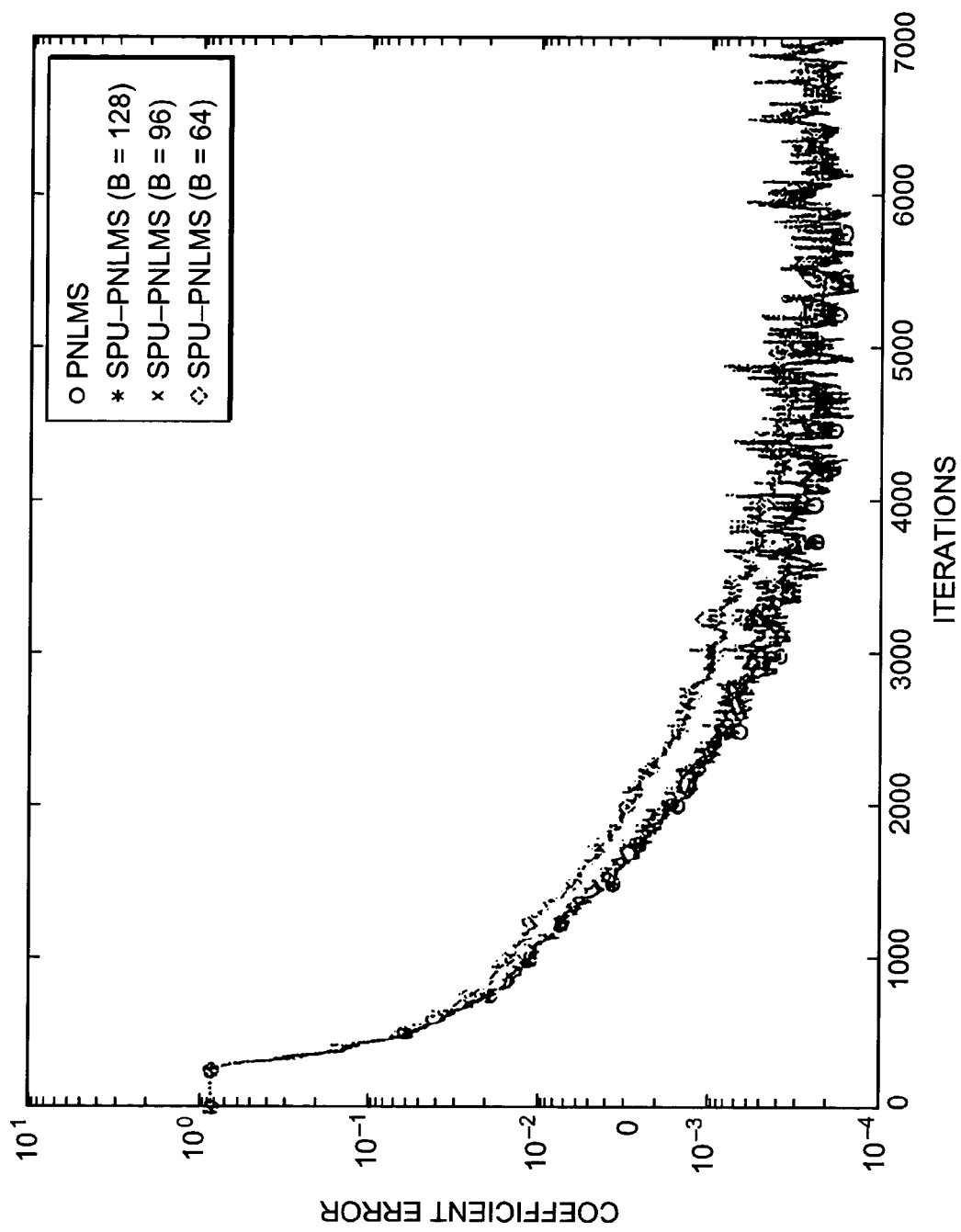

FIG. 8B shows the convergence curves for PNLMS and SPU-PNLMS for different parameter selections. The simulation parameters were N=256, M=256, L=1, and μ=0.4. SPU-PNLMS was simulated for three values of B, viz., 128, 96 and 64, corresponding to ½, ⅜, and ¼ of the filter coefficients being updated at every iteration, respectively. The convergence speed of SPU-PNLMS is almost identical to that of PNLMS for values of B larger than the length of the active network echo path segment, which is 64 in this case.

Figure 9A:
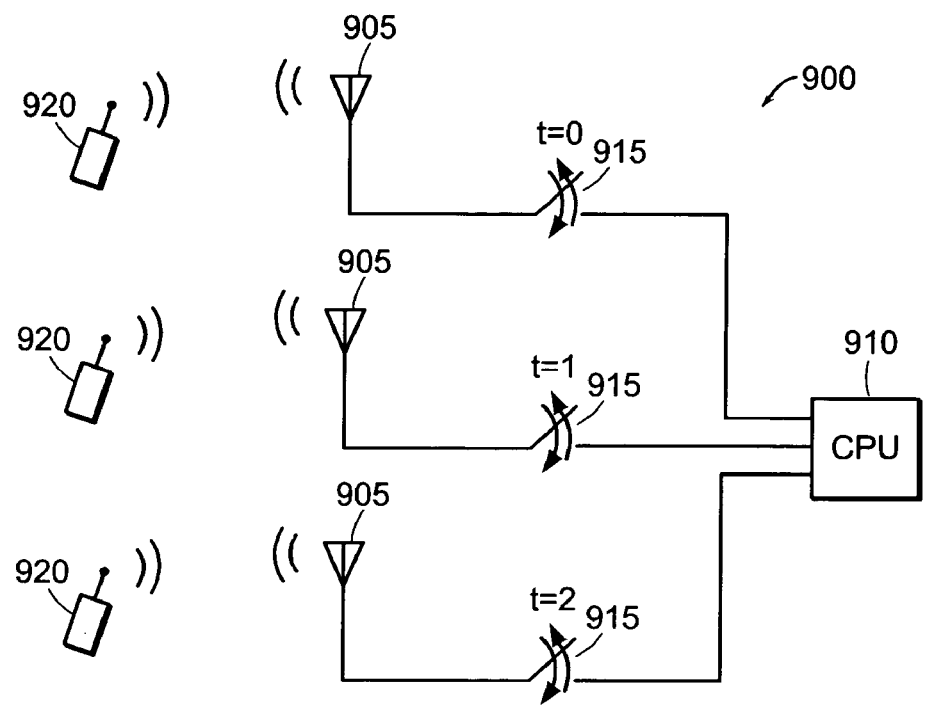
FIG. 9A is a generalized block diagram of a prior art multi-user detection CDMA system that may be coupled to the communications network of FIG. 1.

FIG. 9A is a schematic diagram of a prior art multi-user Code Division Multiple Access (CDMA) system 900. The system includes multiple antenna elements 905 coupled to a central processing unit (CPU) via respective switches 915. The switches are represented as mechanical switches, but it should be understood that the switch may be any type of electronic or mechanical switch to connect the respective antenna element 905 to the CPU at a selectable time instant. The switches 915 operate to allow subscriber terminals 920 to access communication channels via the antenna elements 905 and CPU 910 in a time division multiple access (TDMA) manner.

In this example, the CPU has one receiver (not shown) corresponding to each antenna element 905. The receivers employ adaptive filters. For three antenna elements 905 and three users, there are nine adaptive filters. Each adaptive filter has a high computational complexity. The adaptive filters are updated in a round robin manner.

Figure 9B:
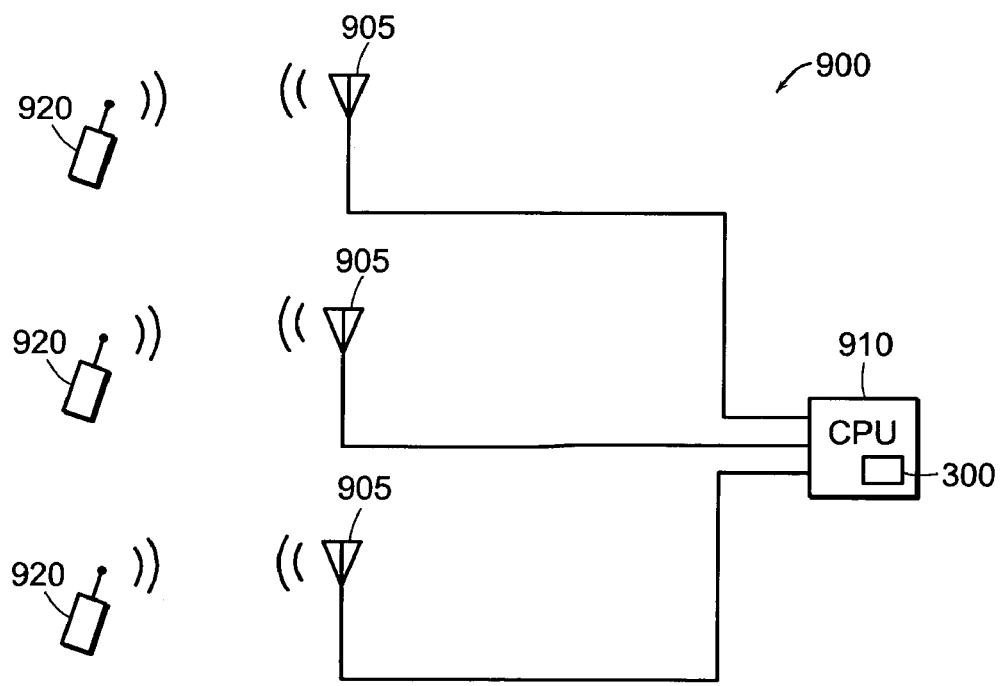
FIG. 9B is a generalized schematic diagram of the CDMA system of FIG. 9A in which an embodiment of the adaptive filter of FIG. 3 is employed.

FIG. 9B is the same CDMA system 900 but without the switches 915. In this case, the adaptive filters in the receivers are replaced with the inventive adaptive filter 300 according to the principles of the present invention. By doing this, rather than updating the demodulation coefficients in a round robin manner, the adaptive filters are able to update subsets of coefficients in all demodulators each time instant.

A reduced-complexity selective-partial-update PNLMS method has been developed for use in adaptive filters, for use in applications such as identification of discrete-time sparse systems. Another application in which this type of adaptive filtering may be deployed is in adaptive network echo cancellation. The adaptive filtering may be derived from the solution of a constrained weighted optimization problem. A time-varying parameter approach has been proposed to remedy the slow convergence of PNLMS after the rapid initial convergence. SPU-PNLMS was also shown to be capable of maintaining the same convergence speed as PNLMS at a reduced complexity.

While this invention has been particularly shown and described with references to preferred embodiments thereof, it will be understood by those skilled in the art that various changes in form and details may be made therein without departing from the scope of the invention encompassed by the appended claims.

What is claimed is:

1. A method for performing adaptive filtering, comprising:
   calculating metrics of subsets, at a given filtering iteration, of input signal values and adaptive filter coefficients of blocks, which compose an adaptive filter, calculating the metrics including forming a weighting matrix as a function of the adaptive filter coefficients and calculating a weighted power of the subsets of the input signal values in the blocks through use of the weighting matrix to obtain the metrics;
   comparing the metrics to select a given subset of the blocks to update;
   updating the adaptive filter coefficients in the selected given subset of the blocks to apply to input signal values during a next filtering iteration;
   filtering input signal values during the next filtering iteration with the blocks including the given selected subset of blocks with coefficients in an updated state to produce output signal values, being the input signal values in a filtered state; and
   outputting the output signal values.

2. The method according to claim 1 further including outputting the output signal values predicted from the input signal values and combining the output signal values and a desired signal, including an echo signal, voice data, and noise, to cancel an echo signal in the desired signal.

3. The method according to claim 1 wherein forming a weighting matrix includes forming a diagonal matrix.

4. The method according to claim 3 wherein the diagonal matrix is a function of the adaptive filter coefficients.

5. The method according to claim 3 wherein the diagonal matrix includes diagonal elements calculated at every iteration.

6. The method according to claim 5 wherein the diagonal elements are a function of a vector having elements being the maximum of (i) the maximum adaptive filter coefficient multiplied by a scale factor or (ii) each of the magnitudes of the adaptive filter coefficients.

7. The method according to claim 3 wherein forming a diagonal matrix includes preventing errors caused by the adaptive filter coefficients being very small.

8. The method according to claim 3 wherein forming a diagonal matrix includes causing an individual adaptive filter coefficient to change when its magnitude is smaller than the largest coefficient.

9. The method according to claim 1 wherein comparing the metrics includes finding the block for which the adaptive filter coefficient is minimal in the squared-Euclidean-norm sense while satisfying a constraint that the adaptive filter coefficient at the next sample time multiplied by the corresponding signal at the present time is identical to a desired signal.

10. The method according to claim 1 wherein comparing the metrics includes determining the block with the smallest weighted squared-Euclidean-norm update.

11. The method according to claim 1 used in applications having long adaptive filters.

12. The method according to claim 11 wherein the applications include channel equalization, sonar, radar, system identification, and echo cancellation.

13. The method according to claim 11 wherein the applications include multi-user detection CDMA systems employing the method for adaptive filtering in a plurality of demodulators, the method further including updating a subset of adaptive filter coefficients in the demodulators each update iteration.

14. A method for performing adaptive filtering, comprising:
   calculating metrics of subsets, at a given filtering iteration, of input signal values and adaptive filter coefficients of blocks, which compose an adaptive filter, calculating the metrics including forming a weighting matrix as a function of the adaptive filter coefficients and calculating a weighted power of the subsets of the input signal values in the blocks through use of the weighting matrix to obtain the metrics;
   comparing the metrics to select a given subset of the blocks to update;
   updating the adaptive filter coefficients in the selected given subset of the blocks to apply to input signal values during a next filtering iteration;
   transitioning at a break point from using a combination of adaptive filter coefficients and input signal values to select the given subset of blocks to update to using only the input signal values during the next filtering iteration;
   filtering input signal values during the next filtering iteration with the blocks including the given selected subset of blocks with coefficients in an updated state to produce output signal values, being the input signal values in a filtered state; and
   outputting the output signal values.

15. The method according to claim 14 wherein the break point is determined from echo return loss enhancement (ERLE) measurements.

16. The method according to claim 14 used in applications having long adaptive filters.

17. The method according to claim 16 wherein the applications include channel equalization, sonar, radar, system identification, and echo cancellation.

18. The method according to claim 16 wherein the applications include multi-user detection CDMA systems employing the method for adaptive filtering in a plurality of demodulators, the method further including updating a subset of adaptive filter coefficients in the demodulators each update iteration.

19. An adaptive filter, comprising:
metric calculation units, to calculate metrics of subsets, at a given filtering iteration, of input signal values and adaptive filter coefficients of blocks, which compose an adaptive filter, the metric calculation units configured to calculate the metrics by forming a weighting matrix as a function of adaptive filter coefficients and calculating a weighted power of the subsets of the input signal values in the blocks through use of the weighting matrix to obtain the metrics;
a selector to compare the metrics to select a given subset of the blocks to update;
an update unit to update the adaptive filter coefficients in the selected given subset of the blocks to apply to input signal values during a next filtering iteration;
a filtering unit to filter input signal values during the next filtering iteration with the blocks including the given selected subset of blocks with coefficients in an updated state to produce output signal values, being the input signal values in a filtered state during; and
an output unit to output the output signal values.

20. The adaptive filter according to claim 19 further including a prediction channel to predict the output signal values from the input signal values and a summation unit to combine the output signal values and a desired signal including an echo signal, voice data, and noise to cancel an echo signal in the desired signal.

21. The adaptive filter according to claim 19 wherein the metric calculation units each form a respective diagonal matrix.

22. The adaptive filter according to claim 21 wherein each diagonal matrix is a function of the respective adaptive filter coefficients.

23. The adaptive filter according to claim 21 wherein each diagonal matrix includes diagonal elements calculated at every iteration.

24. The adaptive filter according to claim 21 wherein each diagonal matrix includes diagonal elements that are a function of a vector having elements being the maximum of (i) the maximum adaptive coefficient multiplied by a scale factor or (ii) each of the magnitudes of the adaptive coefficients.

25. The adaptive filter according to claim 21 wherein the metric calculation units each form the respective diagonal matrix in a manner preventing errors caused by the adaptive filter coefficients being very small.

26. The adaptive filter according to claim 21 wherein the metric calculation units each form the respective diagonal matrix in a manner causing an individual adaptive filter coefficient to change when its magnitude is much smaller than the largest coefficient.

27. The adaptive filter according to claim 19 wherein the selector compares the metrics in a manner that includes finding the block for which the coefficient is minimal in the squared-Euclidian-norm sense while satisfying a constraint that the adaptive coefficient at the next sample time multiplied by the corresponding signal at the present time is substantially identical to the desired response.

28. The adaptive filter according to claim 19 wherein the selector compares the metrics in a manner that includes determining the block with the smallest weighted squared-Euclidean-norm update.

29. The adaptive filter according to claim 19 used in applications having long adaptive filters.

30. The adaptive filter according to claim 29 wherein the applications include channel equalization, sonar, radar, system identification, and echo cancellation.

31. The adaptive filter according to claim 19 used in multi-user detection CDMA systems employing the adaptive filter in a plurality of demodulators, wherein the adaptive filter updates a subset of adaptive filter coefficients in the demodulators each update iteration.

32. An adaptive filter, comprising:
metric calculation units, to calculate metrics of subsets, at a given filtering iteration, of input signal values and adaptive filter coefficients of blocks, which compose an adaptive filter, the metric calculation units configured to calculate the metrics by forming a weighting matrix as a function of adaptive filter coefficients and calculating a weighted power of the subsets of the input signal values in the blocks through use of the weighting matrix to obtain the metrics;
a selector to compare the metrics to select a given subset of the blocks to update;
an update unit to update the adaptive filter coefficients in the selected given subset of the blocks to apply to input signal values during a next filtering iteration;
a transitioning unit to transition at a breakpoint from using a combination of adaptive filter coefficients and input signal values to select the given subset of blocks to update to using only the input signal values during the next filtering iteration;
a filtering unit to filter input signal values during the next filtering iteration with the blocks including the given selected subset of blocks with coefficients in an updated state to produce output signal values, being the input signal values in a filtered state during; and
an output unit to output the output signal values.

33. The adaptive filter according to claim 32 wherein the transition logic determines the breakpoint from echo return loss enhancement (ERLE) measurements.

34. The adaptive filter according to claim 32 used in applications having long adaptive filters.

35. The adaptive filter according to claim 34 wherein the applications include channel equalization, sonar, radar, system identification, and echo cancellation.

36. A computer readable medium having stored thereon sequences of instructions, the sequences of instructions, when executed by a digital processor, causes the processor to:
calculate metrics of subsets, at a given filtering iteration, of input signal values and adaptive filter coefficients of blocks, which compose an adaptive filter, calculating the metrics including forming a weighting matrix as a function of the adaptive filter coefficients and calculating a weighted power of the subsets of the input signal values in the blocks through use of the weighting matrix to obtain the metrics;
compare the metrics to select a given subset of the blocks to update;
update the adaptive filter coefficients in the selected given subset of the blocks to apply to input signal values during a next filtering iteration;
filter input signal values during the next filtering iteration with the blocks including the given subset of blocks with coefficients in an updated state to produce output signal values, being input signal values in a filtered state; and
output the signal values.

* * * * *